United States Patent [19]

Van Devender et al.

[11] Patent Number: 4,598,338
[45] Date of Patent: Jul. 1, 1986

[54] REUSABLE FAST OPENING SWITCH

[75] Inventors: John P. Van Devender; David Emin, both of Albuquerque, N. Mex.

[73] Assignee: The United States of America as represented by the United States Department of Energy, Washington, D.C.

[21] Appl. No.: 564,107

[22] Filed: Dec. 21, 1983

[51] Int. Cl.[4] .......................... H01G 9/18; H01L 45/00
[52] U.S. Cl. ..................................... 361/435; 307/117; 357/2; 357/4; 357/28; 357/61
[58] Field of Search ....................... 307/117; 361/435; 357/1, 2, 4, 28, 61; 320/2

[56] References Cited

U.S. PATENT DOCUMENTS

| 3,399,330 | 8/1968 | Vance | 361/435 |
|---|---|---|---|
| 3,435,255 | 3/1969 | Jensen | 357/61 X |
| 3,469,154 | 9/1969 | Scholer | 357/28 X |
| 3,544,865 | 12/1970 | Holtzberg et al. | 357/61 |
| 3,571,671 | 3/1971 | Ovshinsky | 357/61 X |
| 3,574,676 | 4/1971 | Gambino et al. | 357/61 X |
| 3,656,029 | 4/1972 | Ahn et al. | 357/4 X |
| 3,955,170 | 5/1976 | Geishecker | 338/22.5 D |
| 4,054,940 | 10/1977 | Buchy et al. | 361/435 |
| 4,286,275 | 8/1981 | Heiblum | 357/4 X |

OTHER PUBLICATIONS

M. Shafer et al., "Relationship of Crystal Growth Parameters to the Stoichiometry of EuO as Determined by I.R. Conductivity Measurements," *J. Phys. Chem. Solids*, 1972, vol. 33, pp. 2251–2266.

J. Torrance et al., "Bound Magnetic Polarons and the Insulator-Metal Transition in EuO," *Physical Review Letters*, vol. 29, No. 17, 23 Oct. 1972, pp. 1168–1171.

A. Kornblit et al., "Heat Capacity of $RbMnF_3$ and EuO Near the Magnetic Phase Transitions," *Physics Letters*, vol. 43A, No. 6, 23 Apr. 1973, pp. 531–532.

M. Salamon, "Dipolar-Dominanted Critical Behavior of EuO," *Solid-State Communications*, vol. 13, 1973, pp. 1741–1745.

*Primary Examiner*—R. J. Hickey
*Attorney, Agent, or Firm*—George H. Libman; Albert Sopp; Judson R. Hightower

[57] ABSTRACT

A reusable fast opening switch for transferring energy, in the form of a high power pulse, from an electromagnetic storage device such as an inductor into a load. The switch is efficient, compact, fast and reusable. The switch comprises a ferromagnetic semiconductor which undergoes a fast transition between conductive and insulating states at a critical temperature and which undergoes the transition without a phase change in its crystal structure. A semiconductor such as europium rich europhous oxide, which undergoes a conductor to insulator transition when it is joule heated from its conductor state, can be used to form the switch.

11 Claims, 4 Drawing Figures

REUSABLE FAST OPENING SWITCH

The United States Government has rights in this invention pursuant to Contract No. DE-AC04-76DP00789 between the United States Department of Energy and the Western Electric Company, Inc.

BACKGROUND OF THE INVENTION

1. Field of the Invention

The present invention relates to a switching device and more particularly to a reusable, fast opening switch for producing electrical power pulses.

2. Background of the Invention

Electrical power pulses have been produced by charging an electrostatic energy store, such as a capacitor, and then discharging it, by means of a closing switch, into a load. Because known electrostatic energy stores have a very low energy density, they are generally of large physical dimensions.

Electromagnetic energy storage systems, having very high energy densities are also known. However, when used in connection with short pulse duration ($<<1$ microsecond), high power, pulse forming networks prior art closing switch technology limits the power gain per stage of the electromagnetic energy storage systems to about a factor of 3. This is because prior art closing switch technology is basically directed to fuse type devices, which, as they get larger, require so much of the energy in the storage device to "switch" it, that very little power gain can be realized at the load.

For a typical pulse forming switching system, the power to the switch, $P_{in}$, is equal to the energy supplied from the source ($W_o$) divided by the time it takes to charge up the storage device ($t_o$).

$$P_{in} = \frac{W_o}{t_o} \quad (1)$$

The power delivered to the load is equal to the efficiency of the switching multiplied by the energy supplied ($W_o$) divided by the time it takes to deliver the energy from the storage device to the load ($t_i$).

$$P_{out} = \text{eff.} \times \frac{W_o}{t_i} \quad (2)$$

Therefore the power gain, A, which is the ratio of $P_{out}$ over $P_{in}$, can be described as follows:

$$A = \text{eff.} \times \frac{t_o}{t_i} \quad (3)$$

When the power gain of such systems is about 3, the efficiency drops off as $t_o$ goes up. Therefore, for high power requirements many large stages are required. A fast opening switch would permit the use of magnetic energy storage which may typically have up to one thousand times the energy density of an electrostatic system. However, for such an energy storage system a switch having a large impedance change from a low resistance to a high resistance resulting in a correspondingly large power gain is required.

Moreover, fused wire type switches generally have a relatively low breakdown electric field (about 20 kilovolts per centimeter) and have to be replaced after each "shot". Since many "fuses" are usually involved in such switching systems, there are significant economic and technical disadvantages to the fuse switch approach. In addition, most fuse switches have switching times well in excess of $10^{-8}$ seconds and, as alluded to above, are relatively inefficient, absorbing about 30 percent of the energy available in the energy storage inductor.

Therefore, a need exists for a fast opening (on the order of 1 nanosecond) switch, capable of switching between a highly conductive and highly resistive state and able to handle large current densities. To be useful for pulsed power source application, the switch must be able to switch back and forth repeatedly without damage.

Vance, in U.S. Pat. No. 3,399,330, discloses a solid state switch which changes from a high resistivity to a low resistivity as a current pulse is applied. Return to high resistivity is accomplished by reversing the polarity of current flow. While such a device may be useful for computer memories or the like, it is not applicable to a pulse power generator application where a shift from low resistivity to high resistivity is required in order to produce the desired high power, short duration pulse.

Geishecker, in U.S. Pat. No. 3,955,170, discloses a thermally activated opening switch. In accordance with the device of Geishecker, as the temperature of the device increases, the resistivity of an associated semiconductor also increases. Thus, the device of Geischecker displays a positive temperature coefficient (PTC). Geishecker is representative of many PTC devices presently available. In a 1967 article in Ceramic Age (Vol. 83, pages 44-47, May 1967) there are described many such devices. These PTC devices are used as switches to perform control, detection and regulatory functions.

Barium titanate, the semiconductor material mentioned by Geishecker at column 1, line 42, is not metallic in its lower resistivity state and its low resistance value is relatively high as compared to metallic conductor materials, about 30 ohm-cm. Such a high impedance renders the material unsuitable for use in a pulse power application. While there is no hard barrier in terms of initial resistivity, for practical and efficient operation the initial resistivity of a switch for high power applications should be less than about $10^{-2}$ ohm-cm. As will be further developed below, an additional disadvantage attendant to high initial resistivity is that a large shock wave, proportional to the resistance, is created during switching. If high current densities are to be switched, the resistance must be kept low to prevent the creation of a shock wave which will be larger than the yield strength of the switch material.

In addition, pulse power applications require that a very large increase in resistivity take place at the switch transition from low to high resistivity. In order to be effective the ratio of high to low resistivity must be at least a factor of 400. Higher ratios will yield cleaner switching with diminishing returns as the ratio increases. While in barium titanate, the high/low resistivity ratio is a factor of about $10^4$, the high initial resistivity and slow switching time make this material impractical for high power pulse generation.

Moreover, the PTC-semiconductor transitions in material such as barium titanate involve changes of crystal symmetry. These structural changes seriously impair the usefulness of such materials when large current densities are involved since such materials tend to crack when subjected to large current densities due to the large and rapid changes in crystal structure which occur during transitions.

SUMMARY OF THE INVENTION

It is therefore an object of the present invention to provide a reusable, fast opening switch.

It is a further object of the present invention to provide a fast opening switch capable of passing high current densities.

It is a still further object of the present invention to provide a switch which is metallic in its low resistivity state and operable to rapidly switch in response to the passage of a high current density, into a high resistivity or insulating state.

It is a still further object of the invention to provide a switch which can switch back and forth repeatedly between a metallic and insulating state without sustaining damage.

In accordance with the invention, an energy transfer circuit is provided which comprises an energy source, and an inductor connected to the energy source for receiving energy from the source, and a load switchably connected across the inductor. A reusable, high current, fast opening, semiconductor switch is connected across the load and operable to divert current flowing through the switch to the load as the switch is heated by charging current from the energy source.

Preferably, the energy source can comprise a capacitor bank, a homopolar generator, a battery or the like and a crowbar switch can be used to protect the energy source.

Advantageously, the switch material may comprise a ferromagnetic semiconductor such as oxygen deficient europhous oxide ($EuO_{1-x}$). The switch of the present invention is thermally activated and operative to switch energy stored in the inductor to the load in less than 10 nanoseconds, and preferably in less than 1 nanosecond, in order that high peak powers in the load can be obtained. In addition, the switch of the present invention is very efficient, absorbing less than 10 percent, and in some applications only about 2 percent, of the energy delivered to the load.

Preferably, the semiconductor switch material functions as a metallic conductor with a resistivity of on the order of about $10^{-3}$ to $10^{-6}$ ohm-cm in its low resistivity state and undergoes a resistivity change greater than a factor of about 400 and preferably greater than $10^{10}$ when heated. The resistivity change preferably occurs over a temperature range of about 50° C. and more preferably over a range of about 20° C. Preferably, means are provided to maintain the switch below a critical temperature $T_c$ in which the semiconductor functions as a metallic conductor.

The present invention is also directed to a method of producing electrical power pulses which comprises charging a magnetic energy store and then discharging the magnetic energy store into a load using a reusable, fast opening switch to divert current from the switch into the load, the switch being a thermally activated switch which exhibits a large impedance change to thereby generate a high voltage, short duration, power pulse.

Preferably, the magnetic energy store is charged in about 5 microseconds and discharged in about the range of 1–10 nanoseconds, resulting in a very large power gain.

As used herein, the term magnetic semi-conductor relates to a semiconductor having local magnetic moments. Such semiconductors have electronic and optical properties which alter upon the application of internal or external magnetic fields. Such materials also have magnetic properties which alter upon electronic or optical stimulation. Magnetic semiconductors can be tailored to specific uses by doping or alloying as further developed hereinbelow.

Additional objects, advantages and novel features of the invention will be set forth in part in the description which follows and in part will become apparent to those skilled in the art upon examination of the following or may be learned by practice of the invention. The objects and advantages of the invention may be realized and attained by means of the instrumentalities in combinations particularly pointed out in the appended claims.

BRIEF DESCRIPTION OF THE DRAWINGS

The accompanying drawings, which are incorporated in and form a part of the specification, illustrate a preferred embodiment of the invention and together with the description, serve to explain the principles of the invention. In the drawings.

DETAILED DESCRIPTION OF THE INVENTION

Reference will now be made in detail to the present preferred embodiment of the invention, an example of which is illustrated in the accompanying drawings.

Figure 1:
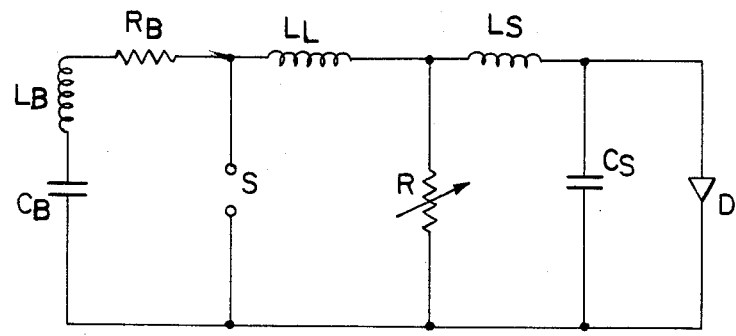
FIG. 1 is a schematic diagram of a circuit utilizing an insulator/conductor switch in accordance with the present invention.

Turning first to FIG. 1, there is illustrated a circuit for producing a power pulse at a load D from a magnetic energy storage device, $L_L$, in a time period of on the order of 10 nanoseconds or less. It should be understood that the switching speed will, to some extent, be dependent upon the load application involved and can be as fast as 1 nanosecond or less, or as slow as desired.

The switch R, which forms the heart of the present invention, transfers magnetic energy stored in the energy storage inductor $L_L$ into the load D which may be resistive, reactive, time varying, distributed, etc. The load of FIG. 1 is an E beam diode which can be used as a source of electrons as developed below with regard to FIG. 4.

The energy required to open the switch R of the present invention is only about 2 percent of the energy delivered to the load. Thus, the energy transfer is very efficient. The switch R is operable to pass a current density of on the order of 300 kiloamps per square centimeter as the inductor charging current in the circuit of FIG. 1 rises to its peak value in approximately 5 microseconds and operable switch from low to high resistance in approximately 1–10 nanoseconds as a result of joule heating from the charging current. The switch R is very compact, very fast, and overcomes the major disadvantages of the prior art devices discussed above.

A high voltage DC source, such as a capacitor bank, is represented in FIG. 1 by a series circuit consisting of $R_B$, $L_B$ and $C_B$. The capacitor bank is preferable for large, stationary applications. For mobile applications a battery or the like can be used. For other remote or mobile applications, a homopolar generator may be preferable. In any event, the source is only used to energize the load inductor $L_L$ which, in the embodiment of FIG. 1 is connected in series with the switch R. A crowbar switch S is connected across the source $C_B$, $L_B$, $R_B$ to short the source out of the circuit after the conductor $L_L$ is charged to thereby protect the source from over voltage.

$L_s$ and $C_s$ represent any stray inductance and stray capacitance respectively on the load side of the switch R. In the embodiment illustrated, an E-beam diode D represents the load into which a power pulse, from the energy stored in the inductor $L_L$, is transferred.

It should be appreciated that the stray inductance $L_s$, if large, will resist the buildup of current in the load since current through an inductor cannot change instantaneously. Therefore, if the inductance of $L_s$ is too large, a large voltage spike may appear across it. This, of course, should be carefully avoided when practicing the invention.

The stray capacitor $C_s$, can actually supply a transmission line effect in the circuit. This effect prevents any voltage from appearing across the inductor $L_s$ until the capacitor $C_s$ has charged. Since at very high frequencies the capacitor $C_s$ has a very low impedance, it can help to minimize the sum of the voltages $V_{Ls}+V_{Cs}$ for a very short time. The operation of FIG. 1 will now be described.

Figure 3:
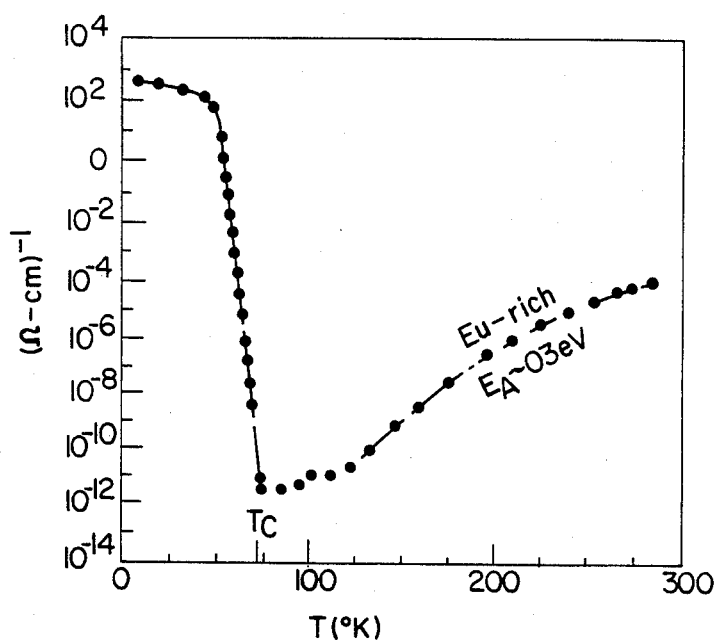
FIG. 3 is a graph illustrating the conductor/insulator transition of the switch material of the switch of FIG. 2.

Assume first that the switch R is initially maintained at a temperature of about 4° K., well below its critical transition temperature $T_c$ as indicated in FIG. 3. As the DC source ($R_B$, $C_B$, $L_B$) supplies charging current to the load inductor $L_L$, the inductor is energized. The energy dissipated in the switch R warms the switch material from its initial temperature of about 4° K. to about 50° K. by joule heating of the switch material. This occurs at the same time as the charging current in the inductor $L_L$ rises to near its maximum value. If the switch is an appropriate magnetic semiconductor of the construction detailed below, it is highly conductive below the critical temperature $T_c$ and undergoes a rapid transition to become an insulator above $T_c$. For the circuit of FIG. 1, $T_c$ is taken to be 50° K. The cross section of the switch should be determined so as to ensure that the current, I, is near its maximum when the switch temperature approaches the critical temperature 50° K. This should preferably occur in a time frame of on the order of 5 microseconds. The bridge wire or crowbar switch S shorts out the DC source to protect it from damage which could be caused by high currents.

Additional heating of the switch R rapidly and dramatically increases its resistance to where it becomes an insulator. This diverts the current into the load. With a properly designed switch, the resistivity change may be a factor of $10^{13}$ or more and occur over a range only about 20° K. While such dramatic resistivity changes are achievable with the present invention, it will be understood by the artisan that high/low resistivity ratios of 400 will provide adequate switching and that changes in resistivity of an order of magnitude for every 10° C. will provide a useful switch. Since the resistivity change is very large and fast (on the order of about 1-10 nanoseconds), pulse power production is very efficient.

In accordance with the present invention, high peak power at the load, in the range of $10^{10}$ through $10^{14}$ watts can be obtained utilizing reasonably sized circuit components. For instance, a relatively low voltage switch R for handling up to 3 kilovolts at about 200 amperes would be on the order of 1 cubic centimeter. For higher voltages (in the 1 to 10 megavolt range) and currents of up to 1 megamp, the switch R might comprise a series of segmented switch sections of the type illustrated in FIG. 2 of about 30 centimeters in length and in the range of 1 to 2 centimeters in diameter. The switch R is reusable and able to be used for many shots without sustaining damage.

The switch R comprises a semiconductor material which does not undergo a phase change in its crystal structure during transitions between its conductive and non-conductive phases. Instead, the switch material undergoes an electronic transition at a critical temperature, $T_c$, which does not affect the lattice symmetry. Moreover, the lattice parameters vary relatively smoothly throughout the transition from the metallic to insulative states. The breakdown voltage of the switch R is very high, and depending upon the switch geometry can be on the order of 500 kilovolts per centimeter for even a relatively small switch. Therefore, large output voltages can be generated utilizing reasonably sized magnetic energy storage elements.

It has now been found that certain doped magnetic semiconductor materials will exhibit the desired switching properties discussed above. Since material doping is a highly developed technology, very precise and reproducible switch materials can be tailored for various applications.

An example of an appropriate magnetic semiconductor material is $EuO_{1-x}$ which is highly conductive below a critical temperature and which becomes an insulator above that temperature. See J. B. Torrance, M. W. Shafer, F. R. McGuire, Physical Review Letters 29, 7 pp. 1168-1171 (1972) hereby incorporated by reference. FIG. 3, which is a plot of the conductivity behavior of Eu rich EuO, is taken from that paper. Referring now to FIG. 3, it can be seen that as the temperature of the material is lowered below 300° K., the conductivity decreases with an activation energy, $E_a$, of about 0.3 eV which is similar to an ordinary semiconductor. Between 120 and 70° K., the conductivity is too low to be accurately measured, i.e. is a nonconductor. Below the ferro-magnetic ordering temperature of 69° K., the conductivity dramatically increases by over 13 orders of magnitude. The material is nonactuated or metallic below 50° C. This behavior is known as an insulatormetal transition.

Other references which provide background material regarding EuO behavior are A. Kornblit, G. Ahlers, and E. Buehler, Heat Capacity of $RbMnF_3$ and EuO near the Magnetic Phase Transitions, Phys. Letters, 43A, 531 (1973), and M. B. Salamon, Dipolar-Dominated Critical Behavior of EuO, Solid State Comm. 13, pp. 1741-1745 (1973) and M. W. Shafer et al, Relationship of Crystal Growth Parameters To The Stoichiometry of EuO, J. Phys. Chem. Solids, 33, pp. 2251-2266 (1972), all of which are hereby incorporated by reference.

Eu rich europium oxide ($EuO_{1-x}$) is only an example of a ferromagnetic semiconductor which undergoes an electronic transition in which the material switches sharply with increasing temperature from being metallic to being a good insulator. It is noted that $EuO_{1-x}$ has a resistivity of less than $10^{-3}$ ohm-cm (i.e. is metallic) at low temperatures and transitions electronically, i.e. without changes or damage to its crystal structure, at temperatures above $T_c$ and therefore can be recycled back and forth without damage. The semiconductor may also comprise other ferromagnetic rare earth chalcogenide alloys with rare earth elements such as Eu, Gd or the like and group six elements such as O, S, Se, Te or the like.

Not all ferromagnetic semiconductor materials can be used to make a switch according to the present invention. To be useful as a switch according to the present invention, the material must (a) exhibit the large conductor/insulator transition described above and (b) not experience a phase change in its crystal structure at the transition. Such phase changes can lead to the destruction of the switch material from internal stresses. In fact, some materials when forced to undergo very rapid crystal structure changes will literally blow themselves into powder due to the creation of large stresses in a small, constant volume. Also, switches having a large initial resistance, for example, greater than about 10 ohm-cm, will experience large shock waves upon switching since the shock power is directly proportional to the resistance.

The physical structure of an exemplary switch will now be described with reference to FIG. 2. Switch material according to the present invention should have a low temperature resistivity ($\rho_o$) of between about $10^{-6}$ to $10^{-2}$ ohms-cm and a ratio of high to low temperature resistivity ($\rho_s$) of at least about 400 and preferably in the range of $10^3$ to $10^{13}$. The switch should have a critical or transition temperature of on the order of about 20° K. and an intrinsic switch time of less than 10 nanoseconds, preferably less than one nanosecond. For most applications, the switch should be able to survive a current density that deposits 100 J/gram in the material within 50 ns and should not suffer damage from repeated, rapid switching or from handling large current densities. The switch material also has excellent thermal conductivity.

Ferromagnetic semiconductors such as EuO and some other rare earth chalcogenide alloys are suitable for switch use. (EuS, NiO and UO$_2$ are anti-ferromagnetic and are not usable.) In these materials the electronic properties can be altered by changes in the internal or external magnetic field. The changes of the internal magnetic field are produced by changing the temperature of the material. These materials can also be tailored to specific applications by doping or alloying. For example, EuO$_{1-x}$N$_x$ and EuNd$_x$O$_{1-x}$N$_x$ exhibit similar metal/insulator behavior as Eu rich EuO.

Preferably, the switch material should have a uniform cross section A so as to have a uniform current density throughout. Otherwise, the switch will experience non-uniform joule heating and some regions of the switch will enter into conductor/insulator transition before others thus making inefficient use of the switch material.

The plates 10 and 12 (FIG. 2) are mechanically or metallurgically bonded to the EuO material. The plates may be made of any good conductor such as steel, copper, aluminum or the like. For relatively low power applications, the switch and its associated components can be constructed on a printed circuit board using standard micro-circuit techniques.

Figure 2:
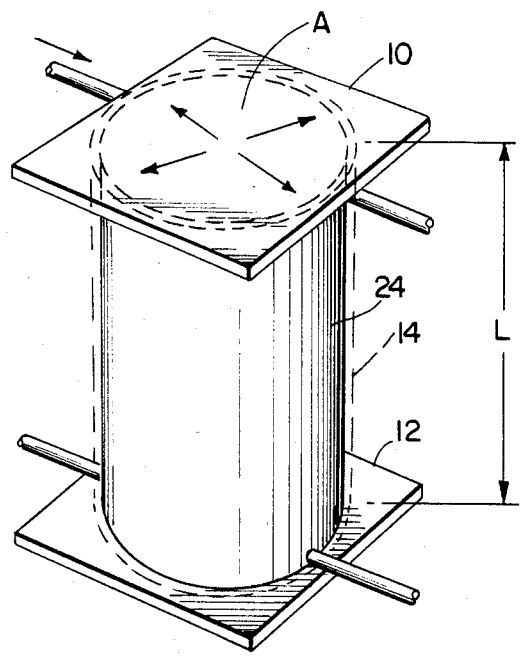
FIG. 2 is an illustration of a switch constructed in accordance with the present invention.

As alluded to above, during high power operation, the switch material will experience a shock wave which travels generally radially through the switch material (for a cylindrical geometry as shown in FIG. 2) and which can actually cause the switch to expand. As the shock wave reaches the outer periphery of the switch material, a relief wave is created which travels radially inward toward the center. The shock and relief waves will oscillate and quickly dampen out but the pressure difference across the initial waves can be very high. In very large power applications, the pressure difference may actually pull the EuO crystal apart.

In order to attenuate the amplitude of the relief wave and to stretch out its duration, a shock absorber may be provided for the crystal. Such a shock absorber can be a simple casing, such as the coaxial sleeve 14 in FIG. 2, made of a resilient material which will operate to absorb or dissipate the initial shock so as to attenuate the relief wave.

An explanation of the switch operation, based on the use of Eu rich europhous oxide (EuO) switch material follows with reference to FIGS. 2 and 3.

The resistivity of Eu-doped EuO increases from $10^{-5}$ Ω-m at T≦50° K. to $10^{10}$ Ω-m at 70° K. as shown in the graph of FIG. 3, i.e., $$\rho_e = 10^{-5} \text{ Ω-m}, T < 50° \text{ K.} \quad (4)$$

$$\rho_e = 10^{-5} \exp(1.73[T-50]), 50° \text{ K.} < T < 70° \text{ K.}$$

where $\rho_e$ is the resistivity of the switch material. Therefore, the switch material is conductive below 50° K. and its resistivity increases exponentially between 50° and 70° K.

The resistance R of the switch of length and cross section A, as shown in FIG. 2, is $$R = 10^{-5} \frac{l}{A} \quad t < t_o \, (T < 50° \text{ K.}) \quad (5)$$

$$R = 10^{-5} \frac{l}{A} e^{1.73(T-50,)} (50°K. < T < 70°K.)$$

The temperature T of the switch is given by $$T = T_o + \frac{A}{l} \int_o^t \frac{Rj^2}{mC_p} dt, \quad (6)$$

where $T_o$ is 50° K. A representative value of $(C_{p\,m})^{-1}$ is $1.12 \times 10^{-6}$ m$^3$ °K./joule. Thus, $$T = T_o + 1.12 \times 10^{-11} \int_o^{t'} j^2 dt, \, t < 50° \text{ K.} \quad (7)$$

$$T = \quad (8)$$

$$50° \text{ K.} + \int_o^t 1.12 \times 10^{-11} e^{1.73(T-50)} j^2 m \, 50° \text{ K.} < T < 70° \text{ K.}$$

Equations (5), (7) and (3) can be solved numerically for a given current density j(t) to analyze the behavior of the switch.

By utilizing the switch of FIG. 2 in a circuit such as that of FIG. 1, the energy in the inductor $L_L$ may be switched to a load requiring a high energy pulse.

A computer analysis of FIG. 1 indicates that the circuit ideally yields an output energy of 315 kilojoules, in a 1.1 MV pulse with a peak current of 6.1 MA and a 10 to 100 percent current risetime of 2 ns. The parameters of the analysis included a standard half megajoule energy source such as a capacitor bank with $C_B$=868 μF, $V_o$=33 kV, $L_B$=4 nH, $R_B$=4×10$^{-4}$ ohms, $L_L$=16 nH, $R_S$=7.5×10$^{-5}$ ohm-cm initially, $$C_S = 100 \, pF \text{ and } R_D = \frac{200}{V_{D}^{\frac{1}{2}}} \text{ ohms.}$$

During the first 4.8 microseconds of analysis, the capacitor $C_B$ discharges 320 kJ into the load inductor $L_L$ and switch R. The current reaches 90 percent of its maximum value at that time. Then the switch R "opens" to divert the current into the load ($L_S, C_S, D$). The total energy expended in the switch (which weighed only 415 grams) was 6.3 kilojoules. Energy per unit mass of 15 joules/gram will not damage the switch.

The load inductance $L_S$ should be kept low to maintain the circuit in a stable condition. For the parameters indicated above, a load inductance $L_S$ of less than 1 nH will not give rise to excessive switch voltage.

In the same analysis using a switch comprising 415 grams of $EuO_{1-x}$, a standard half megajoule capacitor bank was used to charge an inductor $L_L$ in 4.8 microseconds with a peak power of 60 gigawatts. The opening of the switch R produced an output pulse of 6 terrawatts into a resistive load for a power gain of 100 in a single switching stage. The overall efficiency including losses in the capacitor bank an from stay load reactance was 64%. Only 15 joules was deposited in the switch for a switch efficiency of over 98%. The switch is survivable and reusable.

Figure 4:
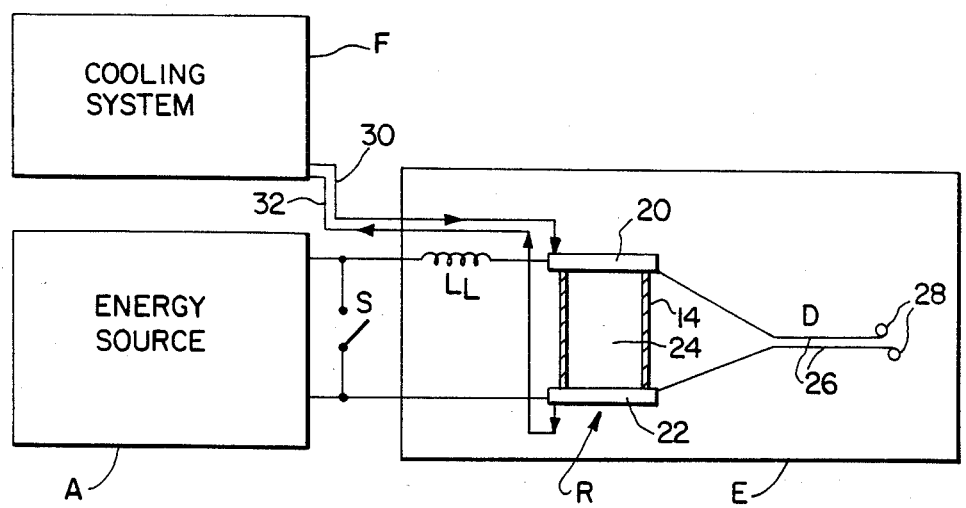
FIG. 4 is an illustration of an energy switching system utilizing the switch of FIG. 2.

As shown in FIG. 4, the switch may be initially maintained at 4° K. or a sufficiently low temperature by an active cooling system F utilizing liquid helium or other suitable coolant and coolant supply and return lines 30 and 32 respectively. In order to prevent an electrical breakdown, in the form of a discharge along the surface of the switch between the plates 10 and 12 during high power operation, the switch (and the load in the case of FIG. 4) may be maintained in a vacuum chamber E. For very high power applications, a vacuum chamber may not be sufficient and a bath of liquid helium may be used to insulate the plates from each other. A helium bath is especially useful for those applications requiring full switch cooling. For most applications, however, the switch material can be adequately cooled by conduction through the plates 10 and 12.

In the application illustrated in FIG. 4, the load consists of spaced plates 26 across which an electron beam is created when the switch R "opens" to divert the energy from the inductor $L_L$ into the load D. Field graded electrodes are used at the edges of the load to prevent the electron beam from breaking down along the edges of the plates 26.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the switch geometry, current carrying capacity, critical temperature, impedance transition magnitude, power handling capacity, switching time, etc. are all dependent on material selections and load applications. The energy source and load configurations illustrated are exemplary only and should not be construed to be limiting. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed:

1. A reusable fast opening switch for pulse power applications comprising:
   a pair of spaced, plate, conductors;
   a bulk magnetic semiconductor disposed between said conductors, said magnetic semiconductor being highly conductive below a critical temperature ($T_C$) and rapidly transforming into an insulator above $T_C$ by undergoing at least an order of magnitude change in resistivity for a temperture change of 10° C.: and
   shock absorber means for protecting said semiconductor from shock waves generated during a resistivity transition.

2. The switch of claim 1, wherein the change in resistivity is on the order of $10^{10}$ over a temperature range of about 20° C.

3. The switch of claim 1, wherein the semiconductor is a doped ferromagnetic semiconductor; whereby said switch is thermally activated in on the order of about 10 nanoseconds.

4. The switch of claim 3, wherein said semiconductor is $EuO_{1-x}$.

5. The switch of claim 3, wherein said semiconductor comprises a ferromagnetic rare earth chalcogenide alloy.

6. The switch of claim 3, wherein said semiconductor has a substantially homogeneous composition and a substantially constant cross-sectional area.

7. The switch of claim 1, wherein the switch comprises means for cooling said semiconductor by convection.

8. The switch of claim 8, wherein the switch comprises means for actively cooling said semiconductor.

9. The switch of claim 8, wherein the switch is maintained in a cryogenic bath.

10. The switch of claim 9, wherein the switch is maintained in a vacuum chamber.

11. The switch of claim 1, wherein said shock absorber means comprises a resilient casing surrounding said semiconductor.

* * * * *